United States Patent
Sumant et al.

(10) Patent No.: US 7,947,329 B2
(45) Date of Patent: May 24, 2011

(54) METHODS OF APPLYING A NANOCRYSTALLINE DIAMOND FILM TO A CUTTING TOOL

(75) Inventors: Anirudha Vishwanath Sumant, Downers Grove, IL (US); Robert William Carpick, Madison, WI (US); Frank Ewald Pfefferkorn, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 842 days.

(21) Appl. No.: 11/520,432

(22) Filed: Sep. 13, 2006

(65) Prior Publication Data
US 2008/0063888 A1    Mar. 13, 2008

Related U.S. Application Data

(60) Provisional application No. 60/843,596, filed on Sep. 11, 2006.

(51) Int. Cl.
*C23C 16/27* (2006.01)

(52) U.S. Cl. ........... 427/249.8; 427/249.12; 427/523; 427/577

(58) Field of Classification Search ........... 427/577, 427/249.8, 249.12
See application file for complete search history.

(56) References Cited

U.S. PATENT DOCUMENTS

| | | | |
|---|---|---|---|
| 5,954,147 A * | 9/1999 | Overstreet et al. | 175/374 |
| 7,192,483 B2 * | 3/2007 | Franz et al. | 117/86 |
| 7,687,146 B1 * | 3/2010 | Freitas, Jr. | 428/408 |
| 2003/0152700 A1 * | 8/2003 | Asmussen et al. | 427/249.8 |
| 2003/0185134 A1 * | 10/2003 | Kimura et al. | 369/112.08 |
| 2004/0154526 A1 * | 8/2004 | Mearini et al. | 117/68 |
| 2005/0019114 A1 * | 1/2005 | Sung | 407/119 |
| 2005/0031785 A1 * | 2/2005 | Carlisle et al. | 427/249.8 |
| 2006/0113546 A1 * | 6/2006 | Sung | 257/77 |
| 2006/0222850 A1 * | 10/2006 | Xiao et al. | 428/408 |
| 2009/0022969 A1 * | 1/2009 | Zhang et al. | 428/216 |

OTHER PUBLICATIONS

Kaczorowski, W., et al., "Characterization of Nanocrystalline Diamond for Cutting Aluminum Alloys". 3rd International Conference on Novel Applications of Wide Bangap Layers, 2001, pp. 138-139. Abstract only.*

Niedzielski, P., et al., "Nanocrystalline Diamond Films for Cutting Tools". 3rd International Conference on Novel Applications of Wide Bangap Layers, 2001, pp. 203-205. Abstract only.*

Olszyna, A., et al., Nanocrystalline diamond-like carbon coatings produced on the Si3N4-TiC composites intended for the edges of cutting tools. Thin Solid Films, 459, (2004), pp. 224-227.*

(Continued)

*Primary Examiner* — Bret Chen
(74) *Attorney, Agent, or Firm* — Bell & Manning, LLC

(57) ABSTRACT

Methods of applying a nanocrystalline diamond film to a cutting tool are provided. In the methods, the cutting tool comprises tungsten carbide and has a cutting edge with a radius of curvature of no more than about 1 μm. The methods can comprise seeding a cutting surface of the cutting tool with a diamond nanopowder, the cutting surface having a reduced cobalt content, and depositing a nanocrystalline diamond film having a thickness of no more than about 1 μm onto the seeded cutting surface. The methods can also comprise implanting carbon ions into a cutting surface of the cutting tool to provide a carbide rich cutting surface and depositing a nanocrystalline diamond film having a thickness of no more than about 1 μm onto the carbide-rich cutting surface.

18 Claims, 3 Drawing Sheets

OTHER PUBLICATIONS

Butler, James E. "Chemical Vapor Deposition Diamond: Maturity and Diversity". The Electrochemical Society Interface, Spring 2003, pp. 22-26.*

Meng, X.M., et al., "Application of CVD nanocrystalline diamond films to cemented carbide drills". International Journal of Refractory Metals & Hard Materials 26 (2008), pp. 485-490.*

Heaney, Patrick, et al., "Effect of Nanocrystalline Diamond Coatings on Micro-End Milling Performance". ICOMM 2006, No. 7., no page numbers.*

Hu, J., et al., "Characterizations of nano-crystalline diamond coating cutting tools". Surface & Coatings Technology 202 (2007) p. 1112-1117.*

Ma, Y.P. et al., "Deposition and characterization of nanocrystalline diamond films on Co-cemented tungsten carbide inserts". Diamond & Related Materials 16 (2007) pp. 481-485.*

Bruhne, Kai, et al., "Nanocrystalline HF-CVD-Grown Diamond and its Industrial Applications". Rev.Adv.Mater.Sci. 10(2005) p. 224-228.*

Krauss, A.R., et al., "Ultrananocrystalline diamond thin films for MEMS and moving mechanical assembly devices," Diamond and Related Materials, vol. 10, pp. 1952-1961, Jan. 20, 2001.

Jackson, M.J., et al., "Manufacture of diamond-coating cutting tools for micromachining applications," Proc. Instn. Mech. Engrs., vol. 217, Part L: J. Materials: Design and Applications, pp. 77-83, Jun. 17, 2002.

Philip, J., et al., "Elastic, mechanical, and thermal properties of nanocrystalline diamond films," Journal of Applied Physics, vol. 93, No. 4, pp. 2164-2171, Feb. 15, 2003.

Herlinger, J., "sp3's Experience using Hot Filament CVD Reactors to Grow Diamond for an Expanding Set of Applications," Proceedings of the 3rd International Conference on Hot-Wire CVD (Cat-CVD) Program, Utrecht University, Utrecht, the Netherlands, Aug. 23, 2004, no page numbers.

Herlinger, J., "sp3's Experience using Hot Filament CVD Reactors to Grow Diamond for an Expanding Set of Applications," Thin Solid Films, vol. 501, Issues 1-2, pp. 65-69, Apr. 20, 2006.

Nitta, Y., et al., "Cutting Performance of a Nanocrystalline Diamond-Coated Tool," New Diamond and Frontier Carbon Technology, vol. 15, No. 4, Apr. 26, 2005, no page numbers.

Brühne, K., et al., "Nanocrystalline HF-CVD-Grown Diamond and Its Industrial Applications," Rev. Adv. Mater. Sci., vol. 10, pp. 224-228, May 18, 2005.

Xu, Z., et al., "Adhesion Improvement of CVD Diamond Coatings on WC-Co Substrates for Machining Applications," Materials Research Society, vol. 843, pp. T3.33.1-T3.33.6, 2005.

Wilson, E.H., "Plasma Source Ion Implantation Technology for Engineering Surfaces of Materials", American Institute of Physics 0-7354-0015 Jun. 2001, no page numbers.

Bugaev, S.P., "Deposition of highly adhesive amorphous carbon films with the use of preliminary plasma-immersion ion implantation", Surface and Coatings Technology 156, 311-316, 2002.

Nono, M.C.A., "Surface modification on 304 SS by plasma-immersed ion implantation to improve the adherence of a CVD diamond film", Surface and Coating Technology 112, 295-298, 1999.

Saito, Y., "Adhesion strength of diamond film on cemented carbide insert", Diamond and Related Materials, 2 , 1391-1395, 1993.

Schwarz, J., "Synthesis of diamond coatings on tungsten carbide with photon plasmatron", Diamond and Related Materials 14, 302-307, 2005.

Sein, H., "Performance and characterisation of CVD diamond coated, sintered diamond and WC-Co cutting tools for dental and micromachining applications", Thin Solid Films 447-448, 455-461, 2004.

Vohra, V., "Effect of Surface Treatments on the Structural and Mechanical Properties of Nanostructured Diamond Coatings on Tungsten Carbide Cutting Tools", Mat. Res. Soc. Symp. Proc. vol. 791 2004, no page numbers.

Walter, K.C., "Advances in PSII techniques for surface modification", Surface and Coatings Technology, 103-104, 205-211, 1998.

Mehlmann et al., Investigation of cobalt behaviour during diamond deposition on cemented carbides, Diamond and Related Materials, 1994, pp. 805-809, vol. 3.

* cited by examiner

METHODS OF APPLYING A NANOCRYSTALLINE DIAMOND FILM TO A CUTTING TOOL

FIELD OF THE INVENTION

In general, the present invention relates to micro-cutting tools with nanocrystalline diamond coatings on their cutting surface. The invention also relates to methods for the preparation of nanocrystalline diamond-coated micro-cutting tools.

BACKGROUND

There is growing interest in high-precision machining to fabricate miniaturized parts for medical devices, micro-satellites, microfluidics, and the optics and electronics industries, with meso-scale machine tool systems (MMTS) which utilize tools with diameters ranging from 10 to 500 µm. Such MMTS technologies complement standard silicon micro-machine fabrication processes with the ability to directly produce true, three-dimensional structures with high accuracy, low cost, and short cycle time. One of the key methods in MMTS technology is micro-end milling. Precision machining with micro-end milling is strongly influenced by the choice of tool materials. Tungsten carbide (WC) with cobalt binder (WC—Co) is widely used as a standard material. However, it suffers from a number of drawbacks such as limited and unpredictable operational life, rapid degradation of performance with use due to tool fatigue and wear, difficulty in machining adhesive metals such as aluminum and copper, and poor surface finish.

To combat the drawbacks of the use of WC—Co as a tool material for MMTS technologies, one possible solution is to coat the WC—Co with harder materials such as diamond. Unfortunately, conventional diamond films contain relatively large crystallites, placing a limitation on the minimum thickness of the films and making such film practical only for larger tools (e.g., tools having a diameter of 500 µm or greater). (See, for example, Jackson, et al., Proc. Instn. Mech. Engrs., Vol. 217, p. 77 (2003).

Bruhne et al., have reported depositing nanocrystalline diamond films on tungsten carbide cutting tools. (See, Bruhne et al., Rev. Adv. Mater. Sci., Vol. 10, p. 224 (2005).) However, the minimum reported thickness of such films is 10 µm, which the authors admit renders the tool incapable of cutting. Only by using a reactive ion etch (RIE), were the authors able to reduce the thickness of the film.

SUMMARY

The present invention provides tungsten carbide-containing surfaces, and particularly tungsten-carbide-containing cutting tools, that are at least partially coated with a thin nanocrystalline diamond (NCD) film. The films are desirably continuous and uniform, with thicknesses of no greater than about 1 µm. The films may be coated onto the cutting edge(s) of a micro-cutting tool to strengthen the tool, thereby extending its lifetime without significantly increasing the diameter or radius of curvature of the cutting surface. Cutting tools that may benefit from the NCD coatings include, but are not limited to, micro-end mills, routers and drills. However, other substrates and tools may also be coated with the NCD coating to improve their performance and/or strength. Such tools include drawing dies, razor blades, and the like.

Methods for producing the NCD-coated substrates and cutting tools are also provided. In one embodiment, the method includes the steps of reducing the cobalt content at the surface (e.g., the cutting surface) of the substrate (e.g., the cutting tool) or coating the surface of the tool with a thin tungsten film; seeding the surface of the substrate with a diamond powder containing nano-scale (e.g., $\leqq$5-10 nm) diamond particles ("diamond nanopowder") or implanting carbon atoms into the surface of the substrate to provide a carbide-rich surface layer; and depositing the NCD coating over at least a portion of the surface. Hot filament chemical vapor deposition is a technique that may be used to deposit the NCD coatings.

DETAILED DESCRIPTION

Figure 1:
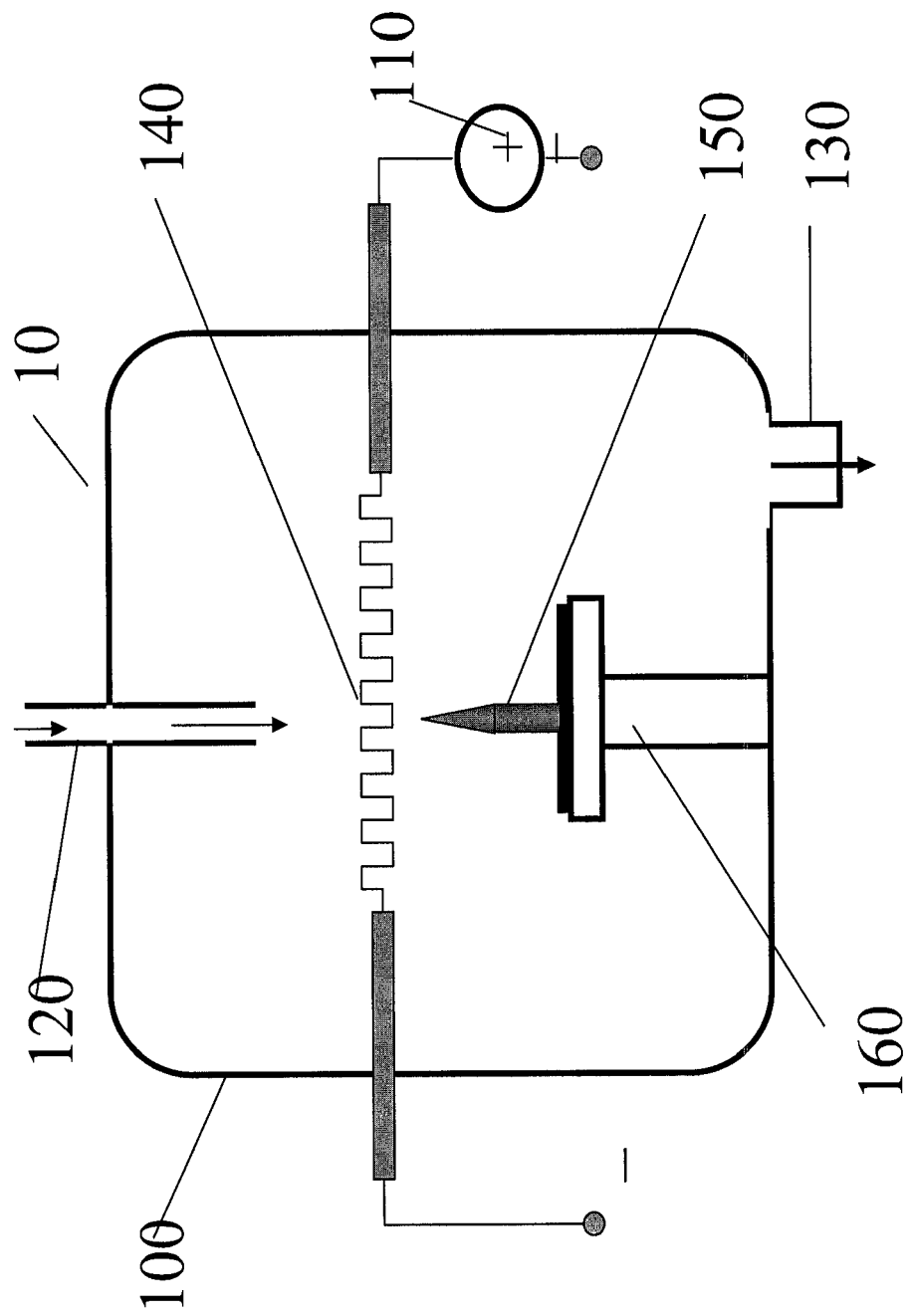
FIG. 1 is a schematic drawing of a hot filament chemical vapor deposition system used for the deposition of NCD coatings on micro-tools.

The following definitions are used throughout the present disclosure:

"AES" is an abbreviation for Auger electron spectroscopy.
"AFM" is an abbreviation for atomic force microscopy.
"BEN" is an abbreviation for bias enhanced nucleation.
"CVD" is an abbreviation for chemical vapor deposition.
"HFCVD" is an abbreviation for hot filament chemical vapor deposition.
"NCD" is an abbreviation for nanocrystalline diamond.
"RIE" is an abbreviation for reactive ion etching.
"RMS" is an abbreviation for root mean square.
"sccm" is an abbreviation for standard cubic centimeters per minute.
"SEM" is an abbreviation for scanning electron microscopy.
"WC" is an abbreviation for tungsten carbide.
"WC—Co" is an abbreviation for tungsten carbide with a cobalt binder.

Generally, disclosed herein are micro-cutting tools coated with an NCD thin film and methods for fabricating such tools. As used herein, the term "micro-cutting tool" refers to a cutting tool having a cutting surface with a diameter of no more than about 500 µm, desirably no more than about 300 µm, more desirably no more than about 200 µm and still more desirably no more than about 100 µm. By way of illustration, the cutting surface of a micro-end mill would be the surface defined by the perimeter of cutting part of the mill, including the cutting edges extending therefrom. The cutting edges on the micro-cutting tools desirably have a radius of curvature of no more than about 2 µm, and desirably no more than about 1 µm.

A first aspect of the invention provides micro-cutting tools comprising tungsten carbide and having a cutting surface and at least one cutting edge; and a hydrogen terminated NCD thin film having a thickness of no more than about 1 µm on at least a portion of the cutting surface.

NCD is a unique form of diamond that is distinguishable from other forms of diamond based on the size of the diamond crystallites in the material. As used herein, the term nanocrystalline diamond refers to a carbon material having a crystallite grain sizes of 10 to 100 nm. In contrast, microcrystalline diamond has a grain size of about 0.5 μm or greater and ultrananocrystalline diamond has a grain size of less than about 5 nm. In addition, NCD is characterized by an electronic bonding character from >5% up to 50% $sp^2$. In contrast, microcrystalline diamond is characterized by an $sp^3$ bonding character and ultrananocrystalline diamond has only about 2-5% $sp^2$ bonding character.

The NCD films are thin films. In some embodiments, the NCD thin films have a thickness of no more than about 1 μm. This includes embodiments where the NCD films have a thickness of no more than about 500 nm, further includes embodiments where the NCD films have a thickness of no more than about 200 nm, still further includes NCD films having a thickness of no more than about 100 nm, and even further includes NCD thin films having a thickness of no more than about 50 nm.

Because the NCD films are so thin, they minimize the overall increase in the radius of curvature of the cutting edges of the coated cutting tools. For example, in some embodiments, the NCD-coated micro-cutting tools will have a radius of curvature of no more than about 2 μm, desirably no more than about 1 μm, more desirably no more than about 0.5 μm and still more desirably no more than about 0.1 μm.

The NCD coatings may be applied to a variety of cutting tools that are made entirely from, are coated with, or otherwise include WC. The cutting tools are generally characterized by a cutting surface having at least one cutting edge, but may have a wide range of geometries. Cutting tools embodied herein include, but are not limited to, end mills, drills, routers, saw blades, razor blades, knives, and scrapers.

A second aspect of the invention provides methods for fabricating micro-cutting tools comprising WC and having a cutting surface and at least one cutting edge; and an NCD thin film having a thickness of no more than about 1 μm on at least a portion of the cutting surface.

One basic embodiment the method includes the steps of seeding a reduced cobalt-content cutting surface of a micro-cutting tool with a diamond nanopowder, and depositing an NCD film having a thickness of no more than about 1 μm onto the seeded cutting surface. The deposition step is desirably carried out using HFCVD. A "reduced cobalt content cutting surface" is a WC surface that has undergone processing to remove cobalt (Co), such that the surface of the tool has a lower cobalt content that the underlying areas, or that has been coated with a tungsten film through which cobalt does not diffuse to the surface after being exposed to heat during the growth process. The reduction of the cobalt content is done to improve the adhesion of the NCD to the surface of the tool. In the untreated state, the WC used to craft cutting tools typically contains about 8-10 wt % Co as a binder phase for the metal. Co interferes with the nucleation of the NCD, hindering film growth. In addition, Co is known to react with carbon at temperatures used in an HFCVD apparatus. Such reaction of Co with the carbon growing the NCD catalyzes the formation of non-diamond carbon deposits, which may weaken the bonding between the NCD and WC.

The reduction of the cobalt content of the cutting surface may be carried out using a chemical etch. Etching may be done to selectively remove small amounts of Co from the surface of the tool, such that the tool is not weakened and NCD deposition is not affected. The etching solution may be a mixture of HF, $HNO_3$, and deionized water in appropriate proportions as listed in Table 2. The process of etching the end of the tool may be achieved by dipping the tool in an etching solution using a micro-positioner. The micro-positioner may have an accuracy of moving the tool along the z-axis to within tens of microns. Cobalt-content reduction on the surface of the tool may be measured by surface-sensitive AES techniques that can detect chemical changes on the surface of a tool, with a depth resolution of approximately 5 nm. Table 1 shows etching times and corresponding Co content as measured using AES. The strength of the etching solution and the length of time the tool is in contact with the etching solution may have an effect on the strength of the tool and the uniformity of the NCD coating on the tool. Etching times of about 3 to 10 seconds, at the strength of the etching solutions tested, appear to produce good quality NCD coatings on tool surfaces while maintaining good adhesion. Thus, etching times range from about 3 seconds to about 10 seconds in some embodiments, from about 4 seconds to about 8 seconds in other embodiments, and from about 5 seconds to about 7 seconds in yet other embodiments. SEM micrographs of unetched and etched tools reveal that the WC surface of the unetched tools is smoother than that of etched tools where the WC graining tends to be more pronounced, suggesting that Co is removed from the grain boundary regions.

TABLE 1

Etching measurements on micro-tool using AES

| Tool | Etching time (s) | Cobalt content (Atomic %) |
|---|---|---|
| 1 | 0 | 5.15 |
| 2 | 3 | 5.13 |
| 3 | 5 | 3.68 |

The reduction of the cobalt content of the cutting surface may be carried out by coating the tool with a thin film of tungsten (e.g., thickness=30-250 nm). This tungsten film prevents cobalt from diffusing to the surface.

After the cutting surface of the micro-tool has been treated to reduce its Co content, the cutting surface is desirably seeded with diamond powder comprising nanoscale diamond particles in order to promote adhesion of the subsequently deposited NCD film. The diamond powder desirably has an average particle size of no greater than about 10, or even 5 nm. Seeding may be accomplished by polishing the surface with diamond powder or by using an ultrasonic treatment in an alcohol solution containing the diamond powder. Agglomerations of diamond particles may be reduced by rinsing the tool repeatedly in alcohol solution after the ultrasonication process. A comparison of SEM images of: (a) a micro-end mill after an ultrasonic nucleation process without any rinsing and (b) a micro-end mill after an ultrasonic nucleation process after multiple rinsing cycles demonstrated that agglomeration was greatly reduced using the rinsing treatment. Failure to limit the agglomerations may cause uneven nucleation of the diamond during the diamond growth. Thus, in another embodiment, methods are provided comprising rinsing a tool after sonicating, but prior to NCD deposition.

Another method of improving the adhesion of the NCD film to the cutting surface is to implant carbon ions into the cutting surface prior to NCD deposition. This carbon implantation results in a carbide-rich surface layer which enhances NCD nucleation. BEN may be used for carbon ion implantation to provide nucleation sites for the growth of NCD thin films. BEN may be carried out by applying a DC bias voltage of about 100-200 volts to the substrate, with respect to the filament, in the presence of a methane gas at high concentration. Using this process, well-bonded, conformal NCD coatings with thicknesses of about 100 nm, or lower, may be achieved. Such processes are not limited to tools, but may also be used in a variety of other applications such as in the coating of wire drawing dies, razor blade manufacturing, and other processes where the size and shape of a tool to be coated with NCD is not readily conducive to polishing or sonication methods Once the micro-tools have been appropriately pre-treated, the NCD films may be formed. As introduced above, micro-tools embodied herein may be coated with NCD films in an HFCVD apparatus as shown in FIG. 1. FIG. 1 is a schematic depiction of a HFCVD system 10 used in the present methods to coat micro tools with an NCD thin film. The HFCVD system 10 consists of a heated filament 140 which is heated to a predetermined temperature using resistive heating from electrical source 110. Precursor gas and hydrogen, in a specified mixing ratio, are introduced to the chamber 100 through inlet 120 and passed over the hot filament 140. The heated substrate (i.e., tool, or item to be coated) 150 is placed on stage 160, in proximity to the heated filament 140. Once the precursor gas and hydrogen have been spent and become off gases, the off gases are exited from the chamber 100 through outlet 130. Ar gas may also be added to the mixture of precursor gas and hydrogen gas. The use of Ar gas in the mixture (e.g., about 5 to 10 volume percent) results in the formation of NCD films with a higher $sp^3$ content. For example, using a volume percent of 5% and 10% in a methane/hydrogen mixture resulted in the formation of NCD films having an $sp^3$ content of 97.1% and 96.7% (as measured by XANES spectroscopy), respectively.

In some embodiments, the temperature of the heated filament 140 is from about 1800° C. to about 2400° C., or from about 2000° C. to about 2200° C., in other embodiments. The temperature at which the heated filament 140 is operated may be dependent upon a number of factors, including the substrate, the precursor gas, and the mixing ratio of precursor gas to hydrogen. The temperature of the filament causes dissociation of $H_2$ into atomic hydrogen (H°) while $CH_4$ dissociates to form hydrocarbon radicals, such as $C_2H_2^*$ or $CH_3^*$. The liberated gaseous species then migrate toward the heated substrate 150, a few millimeters from the filament. The heated substrate is maintained at a temperature of about 700° C. to about 1200° C. in some embodiments, from about 800° C. to about 1100° C. in other embodiments, and from about 850° C. to about 900° C. in yet other embodiments. Under appropriate conditions of filament and substrate temperatures, gas ratios, and chamber pressure, an NCD film is formed on the tool surface. Suitable precursor gases include, but are not limited to, methane, ethane, propane, butane, iso-butane, tert-butane, pentane, iso-pentane, neo-pentane, or mixtures of any two or more thereof. Mixing ratios of precursor gas to hydrogen range from about 0.1 to about 10 vol. % in some embodiments, from about 2 to about 8 vol. % in other embodiments, and from about 3 to about 6 vol. % in yet other embodiments.

The filament temperature and WC tool temperature during the NCD growth may be monitored using an optical pyrometer. Alternatively, the temperature could be measured by a thermocouple embedded in the sample holder. Typical growth parameters to deposit thin, conformal NCD films on the WC micro-tools are shown in Table 2.

Importantly, the present continuous, uniform, conformal, thin NCD films are distinguishable from films made by other processes. For example, diamond films, in which oxygen is used for reactive ion etching, have an oxidized surface that is susceptible to reaction with metal surfaces. Conversely, the presence of hydrogen in the CVD reactor results in hydrogen-terminated diamond films that are more robust and less chemically reactive than their oxidized counterparts. The resulting NCD films are distinguishable from films that have been thinned by an RIE process, since the latter are not hydrogen-terminated and have a graphitic or amorphous soot formed at their etched surfaces. The present NCD film surfaces are free of this soot and are desirably free of oxygen. The term "continuous" indicates that the coating is not broken or splotchy, such that areas of one are desirably also free of oxygen and the underlying tool substrates are exposed through the film. The uniformity of the NCD films may be characterized by their RMS roughness.

EXAMPLES

Materials: The tools used for the NCD coatings were made from WC containing greater than 8% Co. Tools were purchased from Performance Micro Tool, Inc (Janesville, Wis.). The tool tip diameter was approximately 300 μm with a stub length of approximately 600 μm. All new tools were first inspected with an SEM and sorted out for any defects. Broken tools were discarded. The tools were inspected after each step to determine if any tools were broken at various steps.

Micro-Tool Coating and Characterization: Diamond powder nucleated WC micro-end mills were coated with NCD using HFCVD methods as shown in FIG. 1. In this example, the tungsten filament of the HFCVD apparatus was heated to a temperature of approximately 2200° C. A mixture of precursor methane and hydrogen gas, with a methane percentage of 3-6 vol. %, was passed over the heated filament. The heated substrate (i.e., the cutting edge of the end mill) was maintained at a temperature of approximately 850-900° C., as determined by optical pyrometry. Growth parameters used to deposit thin, conformal NCD films on the WC micro-end mills are shown in Table 2. Films grown by this method are very uniform, even at average film thicknesses of approximately 160 nm.

TABLE 2

Nominal NCD coating growth conditions

| Etching | |
| --- | --- |
| Acid composition | |
| 50% HF | 10 ml |
| $HNO_3$ | 20 ml |
| $H_2O$ (De-ionized) | 20 ml |
| Acid Etching Time | 5-7 sec |
| Seeding | |
| Duration of ultrasonic treatment with diamond nanopowder in acetone | 15 min |
| Duration of ultrasonic cleaning with acetone | 10 min |
| Growth | |
| Tool Position | ~3.5 mm below from the filament |
| Methane Flow | 4-6 sccm |
| Hydrogen Flow | 94-96 sccm |
| Argonne Flow | 5-10 sccm |
| Chamber Pressure | 30-50 torr |
| Growth time | 45 min |

Figure 2:
FIGS. 2(a), 2(b), and 2(c) are SEM micrographs of an NCD-coated WC micro-tool (a) as viewed from the tool's cutting edge, (b) as a magnification of the encircled region in (a) showing the microstructure of the NCD film, and (c) as a cross-section the NCD film, with the film bordered by the light lines.

FIG. 2 shows SEM micrographs of an NCD-coated micro-end mill. FIG. 2(a) is the micrograph of the cutting surface, FIG. 2(b) is a side view of a cutting edge, and FIG. 2(c) shows the cross section SEM image taken on another micro-end mill where the NCD film was deposited with a thickness of approximately 160 nm. It is noteworthy that the NCD film is still continuous and conformal at such a low film thickness. Such uniformity and continuity of thin NCD films has been heretofore unknown.

Micro-Tool Evaluation: The micro-end mills were evaluated by a machining test. The machining test used tools with and without NCD coatings. The machining process consisted of the following steps: (a) machining a channel and recording the force necessary during machining, (b) measuring the depth of cut, (c) observing the surface roughness and burring. The typical conditions for the machining are given in Table 3.

TABLE 3

| | |
|---|---|
| Workpiece material | 6061-T6 Aluminum |
| CNC Milling Machine | HAAS TM-1 |
| High-speed Spindle | NSK-HES500 |
| Tool (end mill) | |
| Material | 0.4 μm grain carbide |
| Diameter | 304.8 μm (0.012 in) |
| Flutes | 2 |
| Spindle Speed | 40,000 rpm |
| Feed Rate | 250 mm/min |
| Feed | 6.25 μm/rev |
| Chip Load | 3.125 mm/tooth |
| Coolant | None |
| Depth of Cut | 100 μm |

SEM images of the uncoated and NCD-coated tools after the machining test, were recorded, as well as the corresponding optical images of the machined channel. The SEM images reveal that, after machining, the uncoated tool was covered with Al metal fragments (as confirmed by Energy Dispersive Spectroscopy (EDS) data) and had broken edges, and a significant accumulation of metal burring occurred along the side of the channel. In contrast, the NCD-coated tool showed no sign of measurable wear and no sticking of Al fragments, and the machined channel was clean, with no burr formation. These results were consistent for at least three sets of uncoated and NCD-coated tools under the same testing conditions.

Images of the channel that was cut into the aluminum during the machining test reveal that the NCD-coated tools make a cleaner cut, with little or no burr formation. Roughness analysis of the channels using a 3D optical profilometer revealed somewhat lower RMS roughness (200 nm) in channels machined with NCD-coated tool as opposed to 300 nm in channels machined with uncoated tools. This is not surprising, since the coated tools accumulate metal debris during machining which may cause smearing effects and weld chips to the machined surface, producing a rougher morphology. However, the NCD growth parameters may also be tailored to produce NCD surfaces with smoother morphologies.

Accumulated debris on an uncoated tool may also produce chattering. Chattering occurs as the tool meets the surface that is to be cut. Chatter on the surface correlates to a force spike in the data. This is where the tool has broken and chatters until it stabilizes again at a lower force.

Figure 3:
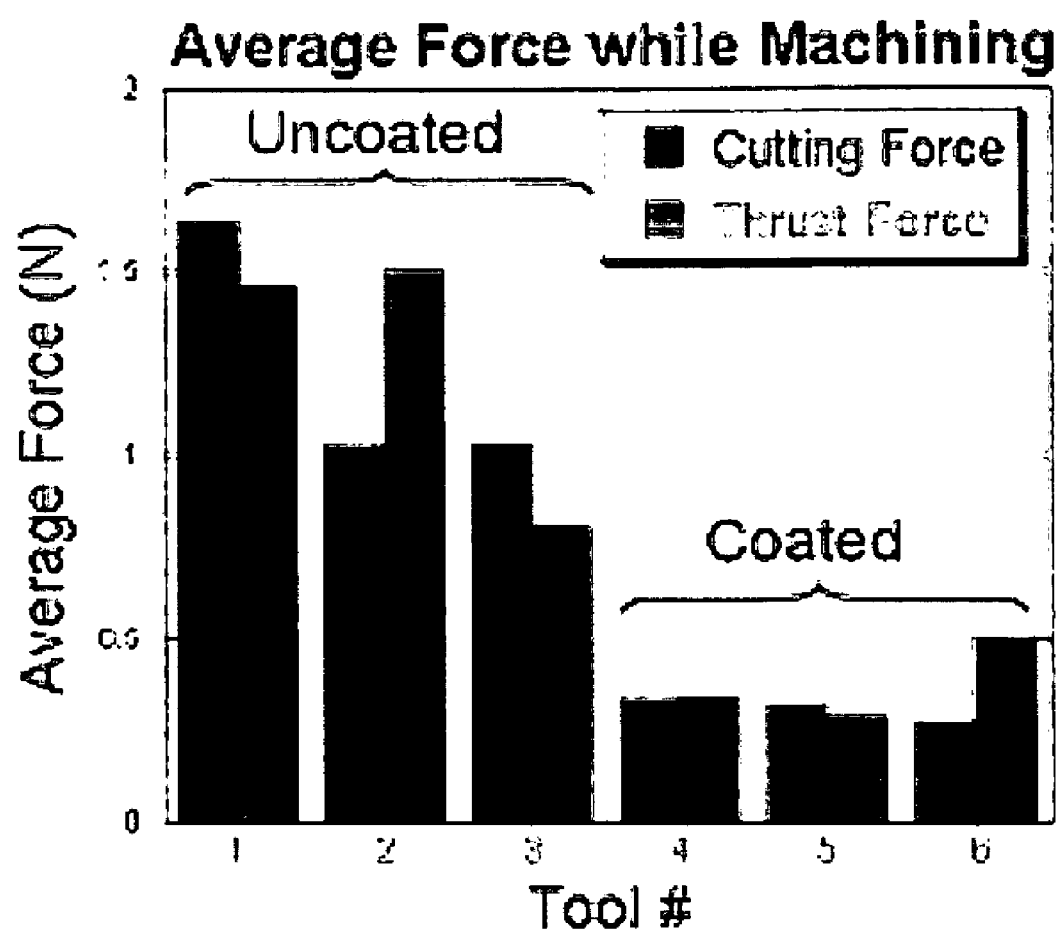
FIG. 3 is a graphical illustration of the average force required while machining a material with the cutting tools embodied herein.

A force dynamometer was used to measure the forces applied during machining to the workpiece along the x, y, and z axes. The z axis was ignored, as the tool was used to machine horizontally. The x and y data are used to calculate the thrust (i.e., radial), $F_t$, and main cutting (i.e., tangential) $F_c$ forces. This force test was done with a depth of cut of 100 μm. The feed rate was slowed to 200 mm/min for all the tools. FIG. 3 is a graphical illustration of $F_t$ and $F_c$ vs. time for the series of uncoated and coated tools. Both forces are reduced for the coated tool, but the tangential force is reduced by about 50%. The coated tool cut a deeper channel. To verify the initial data, three more tools were coated and tested against five other uncoated tools. The NCD coating on all the tools was grown under the same conditions. The uncoated tools showed a force spike at about 0.5 mm where chatter was observed when looking at the work piece. All uncoated tools showed wear, breaking of at least at one corner, and were covered in aluminum. All NCD-coated tools failed show any evidence of breaking or wearing, and had no aluminum sticking to the tool.

For the purposes of this disclosure and unless otherwise specified, "a" or "an" means "one or more." Also, for the purposes of this disclosure, the term "about" in conjunction with a numerical value may be interpreted to refer to a value that is ±10% of the numerical value.

One skilled in the art will readily realize that all ranges discussed can and do necessarily also describe all subranges therein for all purposes, and that all such subranges also form part and parcel of this invention. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third, and upper third, etc.

While some embodiments have been illustrated and described, it should be understood that changes and modifications can be made therein in accordance with ordinary skill in the art without departing from the invention in its broader aspects as defined in the following claims.

We claim:

1. A method of applying a nanocrystalline diamond film to a cutting tool, the cutting tool comprising tungsten carbide and having a cutting edge with a radius of curvature of no more than about 1 μm, the method comprising:
    (a) seeding a cutting surface of the cutting tool with a diamond nanopowder, the cutting surface having a reduced cobalt content; and
    (b) depositing a nanocrystalline diamond film having a thickness of no more than about 1 μm onto the seeded cutting surface.

2. The method of claim 1, further comprising chemically etching the cutting surface to provide the cutting surface having a reduced cobalt content prior to seeding.

3. The method of claim 2, wherein the cobalt content of the cutting surface is at least 28.5 percent lower than that of the underlying tungsten carbide substrate, based on atomic percent.

4. The method of claim 3, wherein the cobalt content of the cutting surface having a reduced cobalt content corresponds to a cobalt content achieved by dipping the cutting tool with a solution of 50% HF, $HNO_3$ and deionized water in a volume ratio of 1:2:2 for a period of 3 to 10 seconds.

5. The method of claim 2, wherein the cobalt content of the cutting surface having a reduced cobalt content corresponds to a cobalt content achieved by dipping the cutting tool with a solution of 50% HF, $HNO_3$ and deionized water in a volume ratio of 1:2:2 for a period of 3 to 10 seconds.

6. The method of claim 1, wherein the cutting surface is coated with a tungsten film prior to seeding.

7. The method of claim 6, wherein the tungsten film has a thickness of about 30 to 250 nm.

8. The method of claim 1, wherein the deposited nanocrystalline diamond film has a hydrogen-terminated surface and is free of graphitic soot.

9. The method of claim 1, wherein depositing the nanocrystalline diamond film comprises depositing the nanocrystalline diamond film in a hot filament chemical vapor deposition apparatus.

10. The method of claim 1, wherein seeding the cutting surface comprises sonicating the cutting surface in a solution comprising a diamond nanopowder.

11. The method of claim 1, wherein the nanocrystalline diamond film is a continuous film.

12. A method of applying a nanocrystalline diamond film to a cutting tool, the cutting tool comprising tungsten carbide and having a cutting edge with a radius of curvature of no more than about 1 μm, the method comprising:

(a) implanting carbon ions into a cutting surface of the cutting tool to provide a carbide rich cutting surface; and (b) depositing a nanocrystalline diamond film having a thickness of no more than about 1 μm onto the carbide-rich cutting surface.

13. The method of claim 12, further comprising chemically etching the cutting surface to provide a cutting surface having a reduced cobalt content.

14. The method of claim 12, wherein the deposited nanocrystalline diamond film has a hydrogen-terminated surface and is free of graphitic soot.

15. The method of claim 12, wherein depositing the nanocrystalline diamond film comprises depositing the nanocrystalline diamond film in a hot filament chemical vapor deposition apparatus.

16. The method of claim 15, wherein the nanocrystalline diamond film has an sp3-bonded content of at least about 95%.

17. The method of claim 12, wherein implanting carbon ions into the cutting surface is accomplished with a bias-enhanced nucleation process.

18. The method of claim 12, wherein the nanocrystalline diamond film is a continuous film.

* * * * *

UNITED STATES PATENT AND TRADEMARK OFFICE
Certificate

Patent No. 7,947,329 B2　　　　　　　　　　　　　　　　　　　　　　　　Patented: May 24, 2011

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Anirudha Vishwanath Sumant, Downers Grove, IL (US); Robert William Carpick, Madison, WI (US); Frank Ewald Pfefferkorn, Madison, WI (US); and Patrick J. Heaney, Middleton, WI (US).

Signed and Sealed this Seventh Day of May 2013.

<div style="text-align:right">
TIMOTHY H. MEEKS<br>
<i>Supervisory Patent Examiner</i><br>
Art Unit 1715<br>
Technology Center 1700
</div>